(12) United States Patent
Xie et al.

(10) Patent No.: US 9,117,908 B2
(45) Date of Patent: Aug. 25, 2015

(54) METHODS OF FORMING REPLACEMENT GATE STRUCTURES FOR SEMICONDUCTOR DEVICES AND THE RESULTING SEMICONDUCTOR PRODUCTS

(71) Applicant: GLOBALFOUNDRIES Inc., Grand Kayman, KY (US)

(72) Inventors: Ruilong Xie, Niskayuna, NY (US); Xiuyu Cai, Niskayuna, NY (US); Andy C. Wei, Queensbury, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 30 days.

(21) Appl. No.: 14/107,279

(22) Filed: Dec. 16, 2013

(65) Prior Publication Data
US 2015/0171216 A1   Jun. 18, 2015

(51) Int. Cl.
| | |
|---|---|
| *H01L 21/311* | (2006.01) |
| *H01L 29/78* | (2006.01) |
| *H01L 29/66* | (2006.01) |
| *H01L 21/02* | (2006.01) |
| *H01L 21/28* | (2006.01) |

(52) U.S. Cl.
CPC ........ *H01L 29/7851* (2013.01); *H01L 21/0217* (2013.01); *H01L 21/02164* (2013.01); *H01L 21/28035* (2013.01); *H01L 21/31111* (2013.01); *H01L 29/6656* (2013.01); *H01L 29/66545* (2013.01); *H01L 29/66795* (2013.01)

(58) Field of Classification Search
CPC ............ H01L 21/0228; H01L 21/8238; H01L 21/845; H01L 21/02175; H01L 21/3212; H01L 21/76205; H01L 21/762; H01L 21/76224; H01L 21/76831; H01L 23/53271; H01L 27/1104; H01L 27/0251
USPC ......... 438/700, 270, 680, 692, 723, 724, 458, 438/786, 787, 791; 257/E21.006, E21.014, 257/E21.046, E21.051, E21.126, E21.127, 257/E21.17, E21.151, E21.267, E21.278, 257/E21.293, E21.304, 21.423, E21.435, 257/E21.545, E21.546, E21.547
See application file for complete search history.

(56) References Cited

U.S. PATENT DOCUMENTS

| | | | | |
|---|---|---|---|---|
| 6,255,187 | B1 * | 7/2001 | Horii | 438/396 |
| 6,873,048 | B2 * | 3/2005 | Gao et al. | 257/750 |
| 6,967,131 | B2 * | 11/2005 | Saenger et al. | 438/199 |
| 8,647,937 | B2 * | 2/2014 | Toh et al. | 438/183 |

* cited by examiner

*Primary Examiner* — David Nhu
(74) *Attorney, Agent, or Firm* — Amerson Law Firm, PLLC

(57) ABSTRACT

One method disclosed includes, forming a sacrificial gate structure trench in a stack of sacrificial material layers, forming a sacrificial gate structure within the trench, performing at least one process operation to remove at least portions of the stack of sacrificial material layers and thereby expose sidewalls of the sacrificial gate structure, forming a sidewall spacer adjacent the exposed sidewalls of the sacrificial gate structure, removing the sacrificial gate structure so as to define a replacement gate cavity between the spacers, forming a replacement gate structure in the replacement gate cavity, and forming a gate cap above the replacement gate structure within the replacement gate cavity.

15 Claims, 17 Drawing Sheets

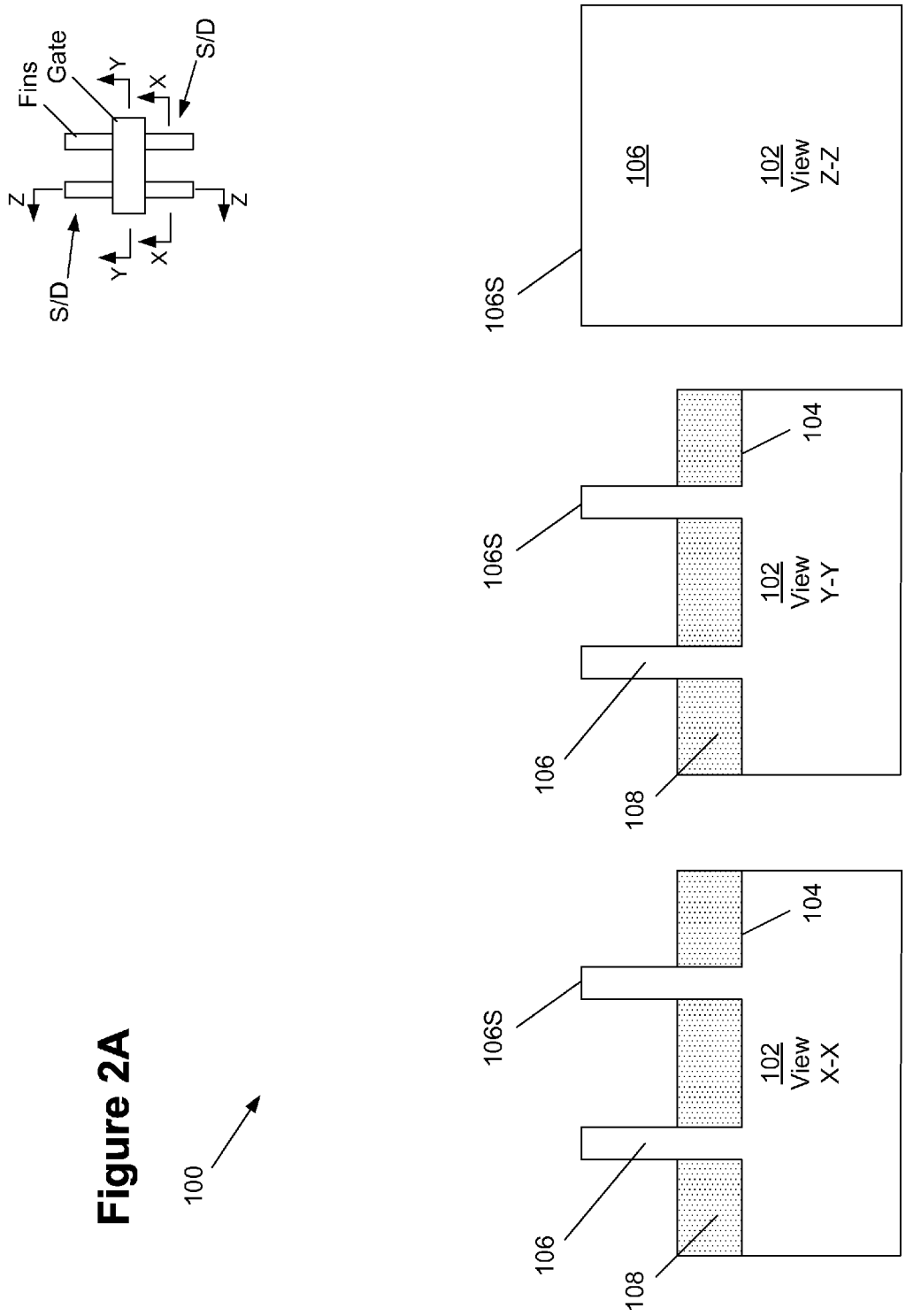

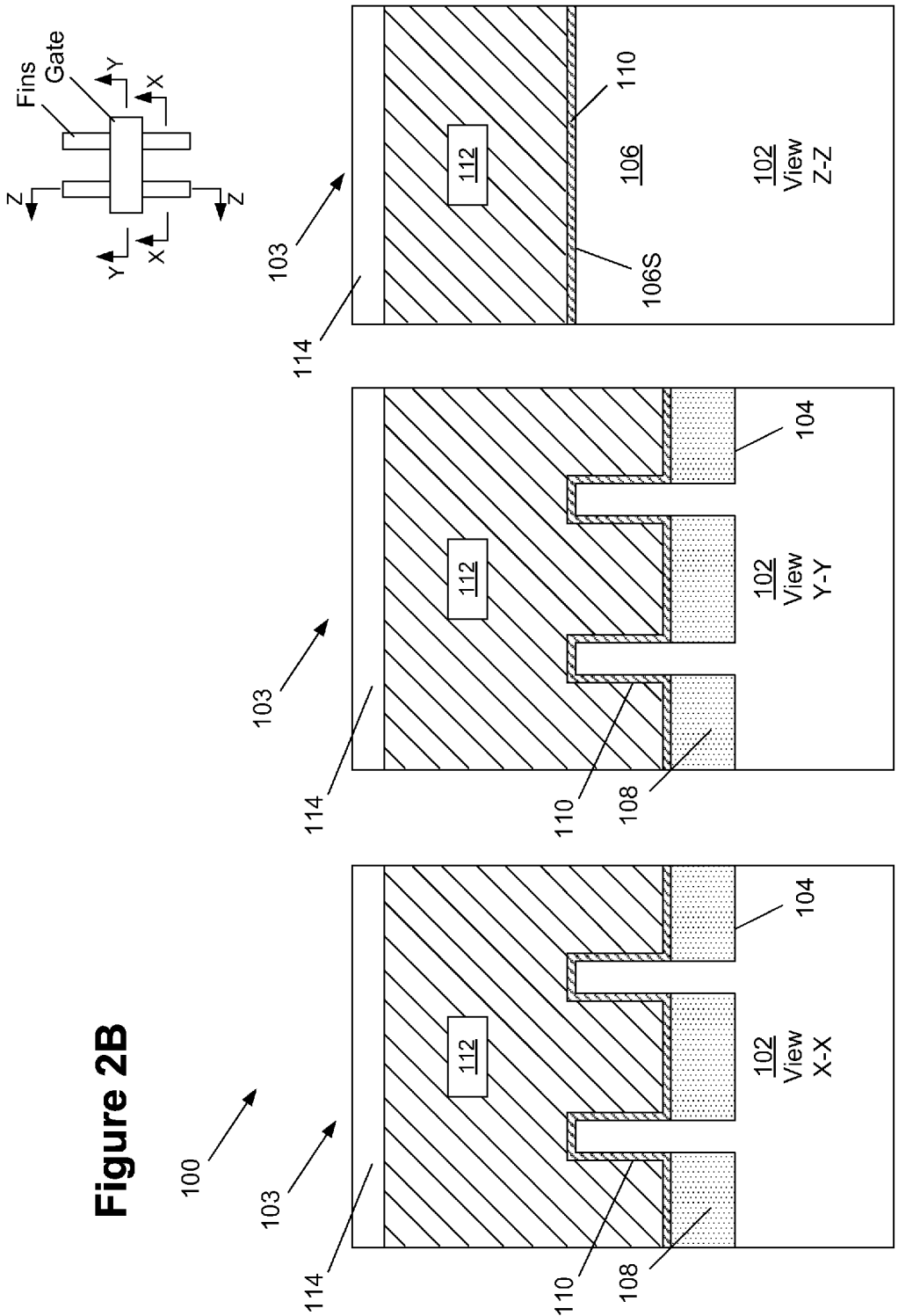

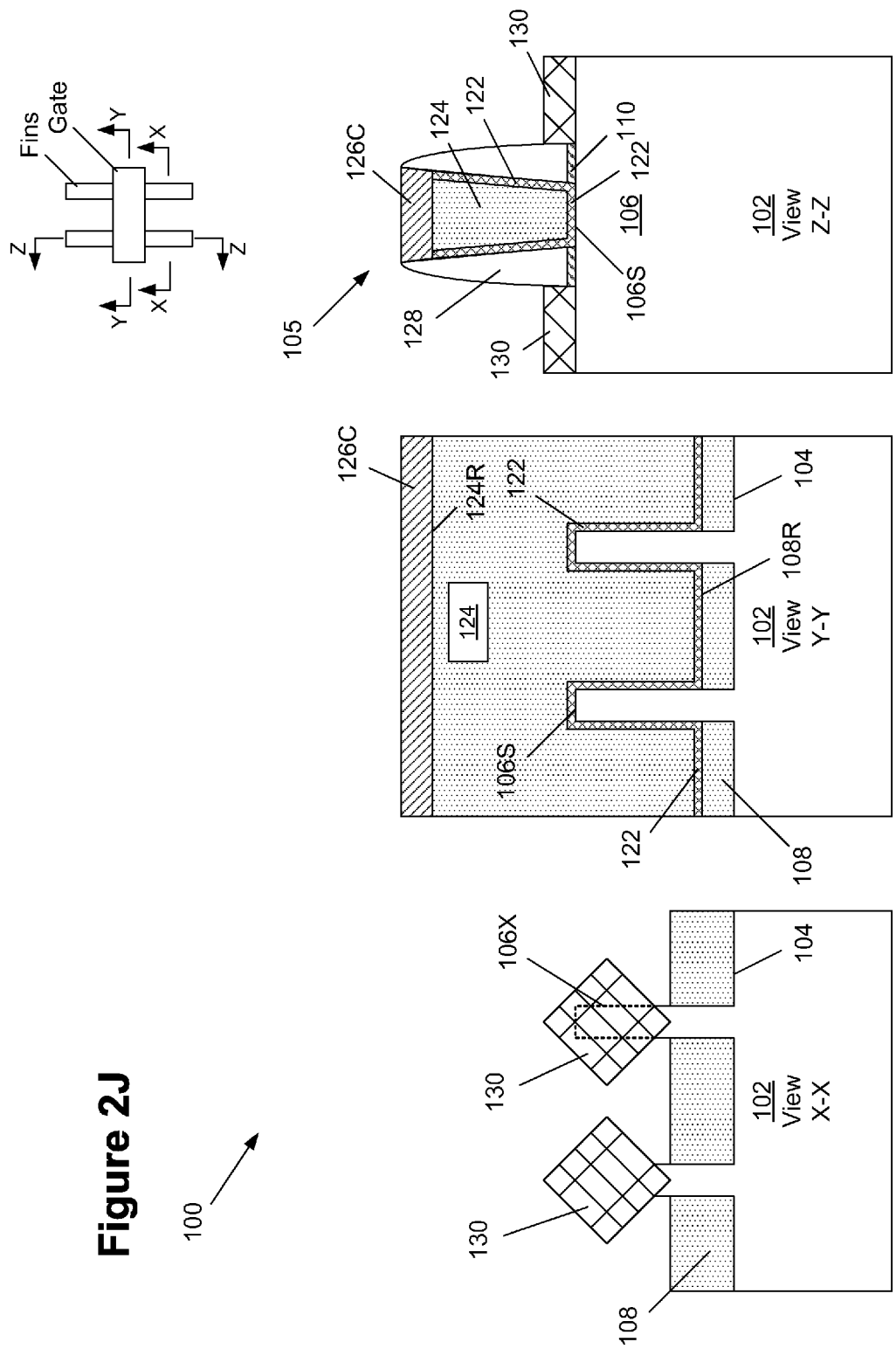

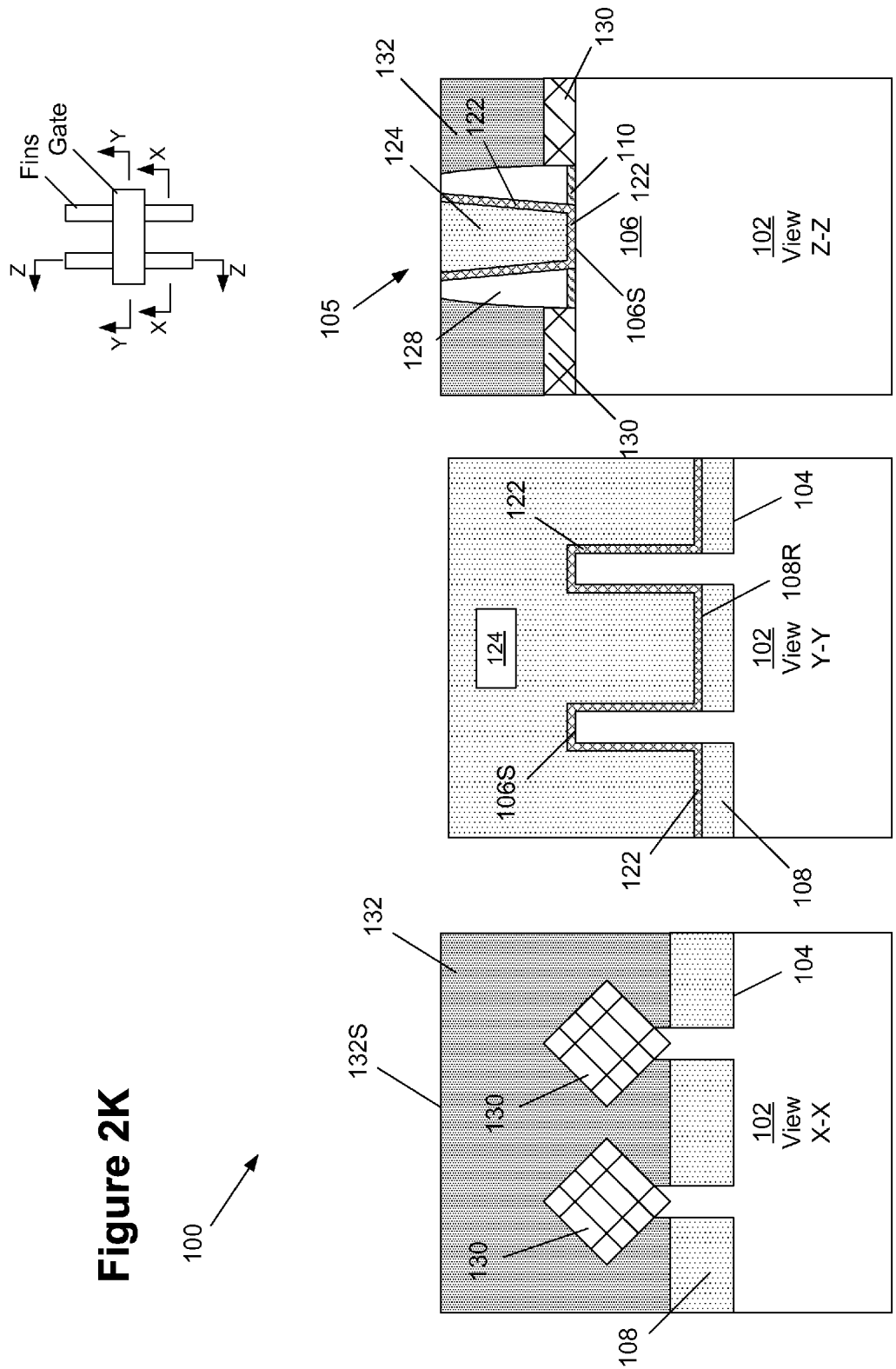

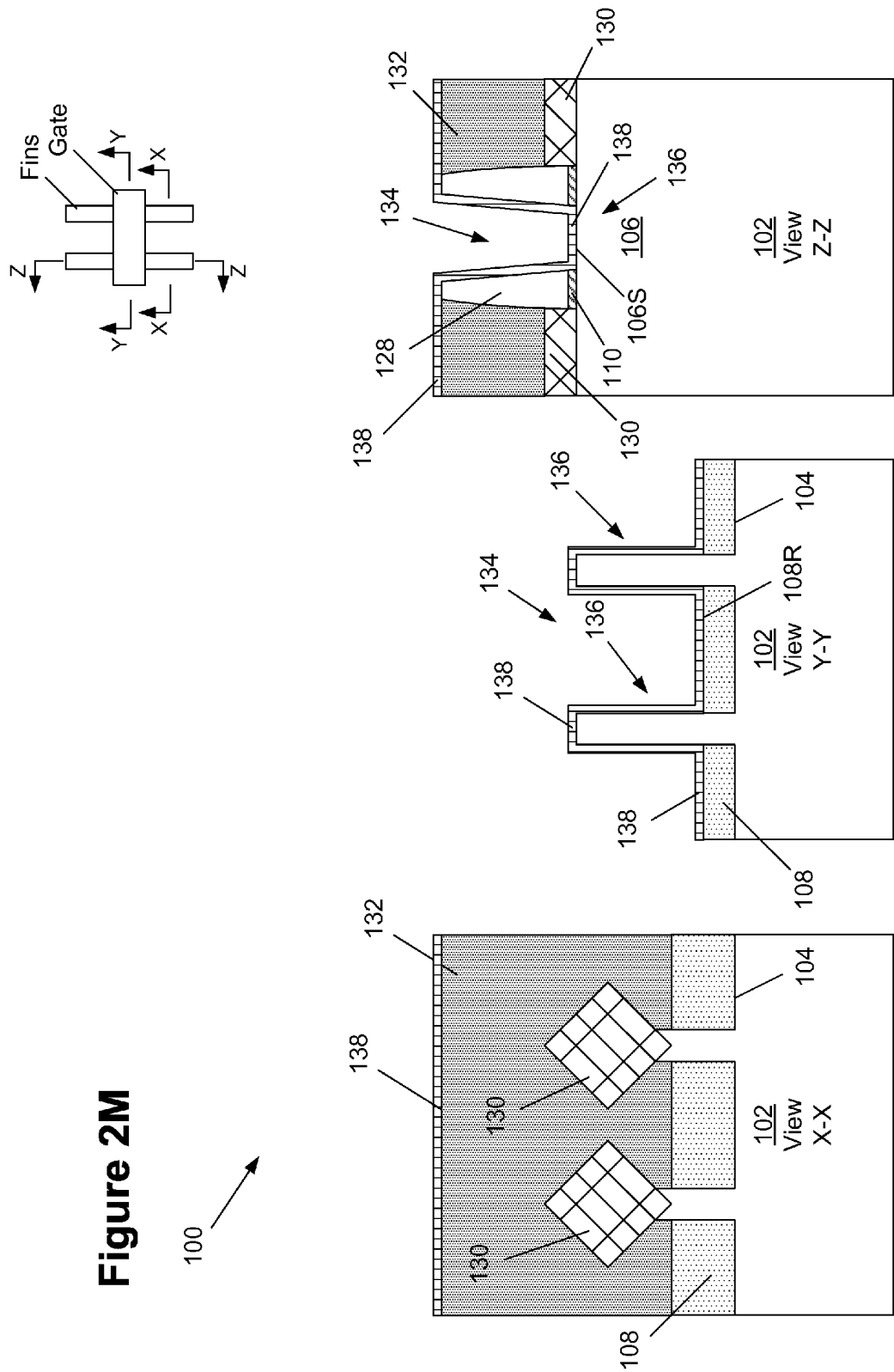

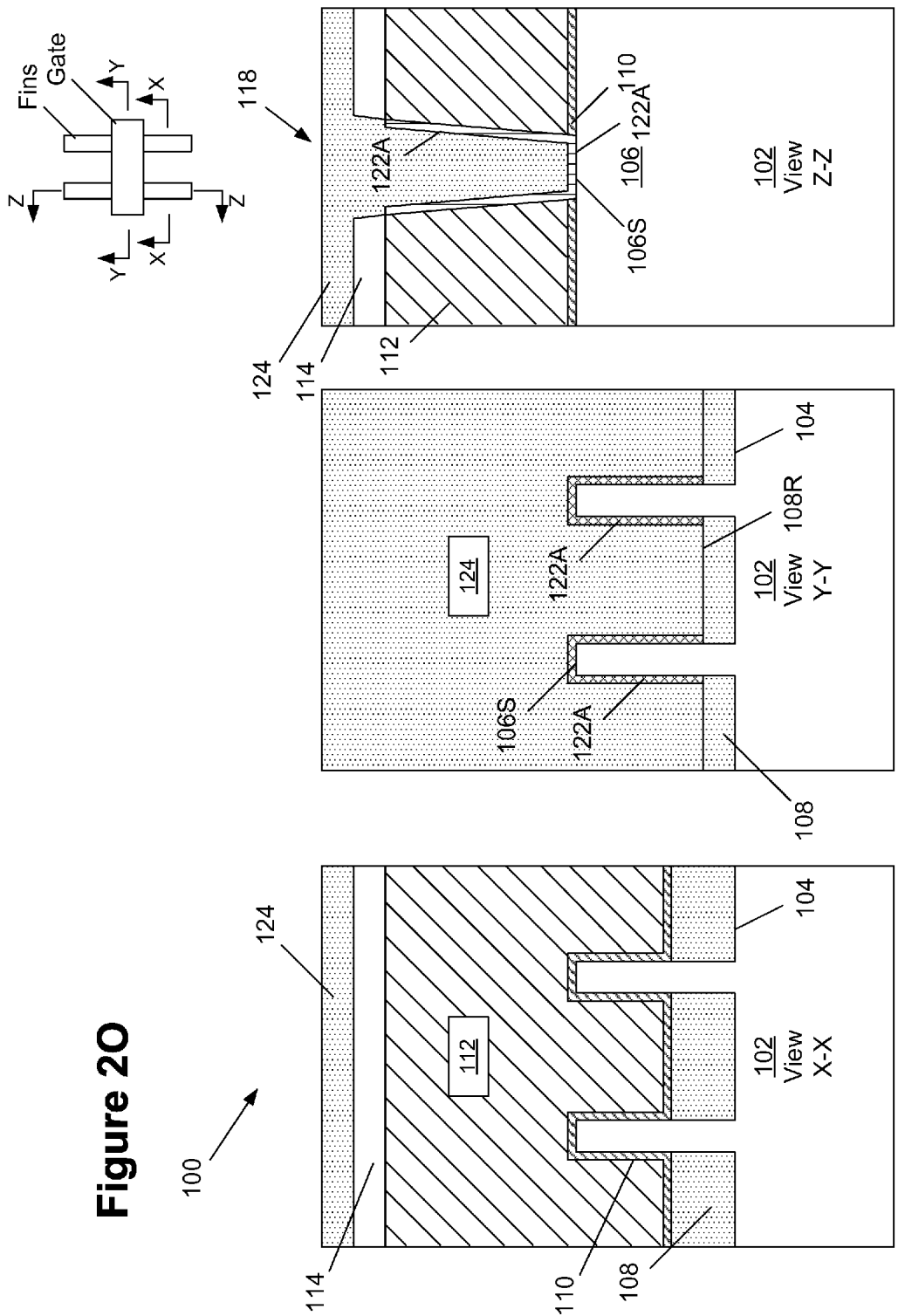

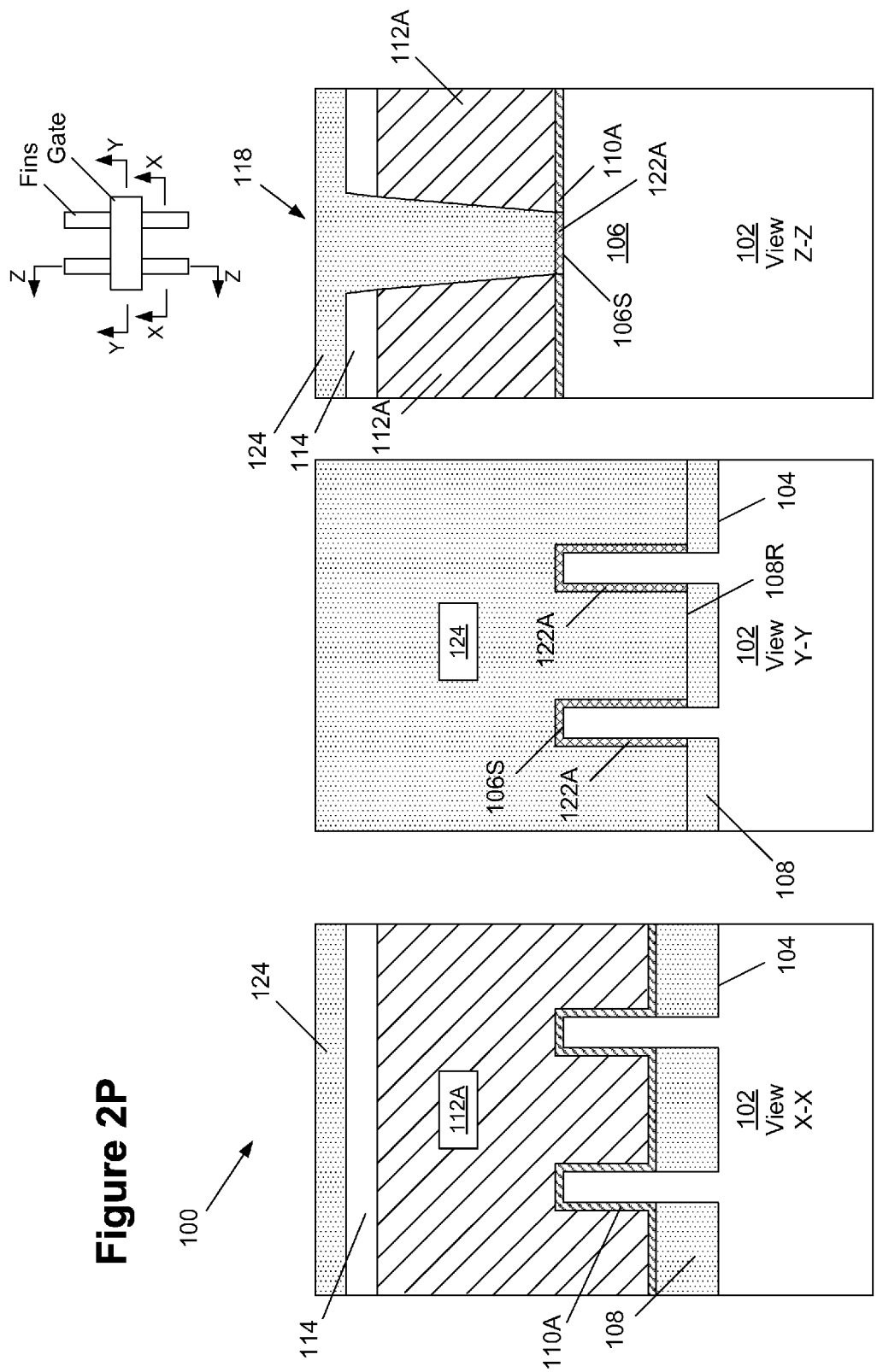

METHODS OF FORMING REPLACEMENT GATE STRUCTURES FOR SEMICONDUCTOR DEVICES AND THE RESULTING SEMICONDUCTOR PRODUCTS

BACKGROUND OF THE INVENTION

1. Field of the Invention

The present disclosure generally relates to the fabrication of integrated circuits, and, more particularly, to various methods of forming replacement gate structures for semiconductor devices, such as planar and 3D devices, and the resulting semiconductor devices.

2. Description of the Related Art

In modern integrated circuits, such as microprocessors, storage devices and the like, a very large number of circuit elements, especially transistors, are provided and operated on a restricted chip area. In integrated circuits fabricated using metal-oxide-semiconductor (MOS) technology, field effect transistors (FETs) (both NMOS and PMOS transistors) are provided that are typically operated in a switching mode. That is, these transistor devices exhibit a highly conductive state (on-state) and a high impedance state (off-state). FETs may take a variety of forms and configurations. For example, among other configurations, FETs may be either so-called planar FET devices or three-dimensional (3D) devices, such as FinFET devices.

A field effect transistor (FET), irrespective of whether an NMOS transistor or a PMOS transistor is considered, and irrespective of whether it is a planar or 3D FinFET device, typically comprises doped source/drain regions that are formed in a semiconductor substrate that are separated by a channel region. A gate insulation layer is positioned above the channel region and a conductive gate electrode is positioned above the gate insulation layer. The gate insulation layer and the gate electrode may sometimes be referred to as the gate structure for the device. By applying an appropriate voltage to the gate electrode, the channel region becomes conductive and current is allowed to flow from the source region to the drain region. In a planar FET device, the gate structure is formed above a substantially planar upper surface of the substrate. In some cases, one or more epitaxial growth processes are performed to form epi semiconductor material in recesses formed in the source/drain regions of the planar FET device. In some cases, the epi material may be formed in the source/drain regions without forming any recesses in the substrate for a planar FET device. The gate structures for such planar FET devices may be manufactured using so-called "gate-first" or "replacement gate" (gate-last) manufacturing techniques.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. FIG. 1 is a perspective view of an illustrative prior art FinFET semiconductor device "A" that is formed above a semiconductor substrate B that will be referenced so as to explain, at a very high level, some basic features of a FinFET device. In this example, the FinFET device A includes three illustrative fins C, a gate structure D, sidewall spacers E and a gate cap F. The gate structure D is typically comprised of a layer of insulating material (not separately shown), e.g., a layer of high-k insulating material or silicon dioxide, and one or more conductive material layers (e.g., metal and/or polysilicon) that serve as the gate electrode for the device A. The fins C have a three-dimensional configuration: a height H, a width W and an axial length L. The axial length L corresponds to the direction of current travel in the device A when it is operational. The portions of the fins C covered by the gate structure D is the channel region of the FinFET device A. In a conventional process flow, the portions of the fins C that are positioned outside of the spacers E, i.e., in the source/drain regions of the device A, may be increased in size or even merged together (a situation not shown in FIG. 1) by performing one or more epitaxial growth processes. The process of increasing the size of or merging the fins C in the source/drain regions of the device A is performed to reduce the resistance of source/drain regions and/or make it easier to establish electrical contact to the source/drain regions. Even if an epi "merger" process is not performed, an epi growth process will typically be performed on the fins C to increase their physical size. In the FinFET device A, the gate structure D may enclose both sides and the upper surface of all or a portion of the fins C to form a tri-gate structure so as to use a channel having a three-dimensional structure instead of a planar structure. In some cases, an insulating cap layer (not shown), e.g., silicon nitride, is positioned at the top of the fins C and the FinFET device only has a dual-gate structure (sidewalls only). The gate structures D for such FinFET devices may be manufactured using so-called "gate-first" or "replacement gate" (gate-last) manufacturing techniques.

Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to significantly reduce short channel effects. When an appropriate voltage is applied to the gate electrode of a FinFET device, the surfaces (and the inner portion near the surface) of the fins C, i.e., the vertically oriented sidewalls and the top upper surface of the fin, form a surface inversion layer or a volume inversion layer that contributes to current conduction. In a FinFET device, the "channel-width" is estimated to be about two times (2×) the vertical fin-height plus the width of the top surface of the fin, i.e., the fin width (for a tri-gate device). Multiple fins can be formed in the same foot-print as that of a planar transistor device. Accordingly, for a given plot space (or foot-print), FinFETs tend to be able to generate significantly higher drive current density than planar transistor devices. Additionally, the leakage current of FinFET devices after the device is turned "OFF" is significantly reduced as compared to the leakage current of planar FETs, due to the superior gate electrostatic control of the "fin" channel on FinFET devices. In short, the 3D structure of a FinFET device is a superior MOSFET structure as compared to that of a planar FET, especially in the 20 nm CMOS technology node and beyond.

In a typical replacement gate process, the sacrificial gate structure or "dummy gate" structure is formed by depositing (or growing) a layer of silicon dioxide (the sacrificial gate insulation material) on the substrate and depositing a layer of polysilicon or amorphous silicon (the sacrificial gate electrode material) on the layer of silicon dioxide. A layer of gate cap material (e.g., silicon nitride) is then typically deposited above the layer of sacrificial gate electrode material. A patterned etch mask, e.g., photoresist, is then formed above the gate cap layer and the stack of materials are etched to define the sacrificial gate structure (the gate insulation layer and the gate electrode material layer) and the gate cap positioned thereabove. The sacrificial gate structure has a line-type configuration. Importantly, using such a processing sequence, the sacrificial gate structure tends to be outwardly tapered, i.e., it is wider at the bottom of the sacrificial gate structure (near the substrate) than it is at the top of the sacrificial gate structure. Sidewall spacers are then formed adjacent such an outwardly-tapered sacrificial gate structure. Ultimately, the sacrificial gate structure will be removed so as to define a replacement gate cavity between two spacers. Unfortunately, in such a process flow, the replacement gate cavity will also have this same outwardly-tapered configuration wherein the cavity is narrower at the top of the cavity than it is at the bottom of the replacement gate cavity. Such an outwardly-tapered replacement gate cavity makes it extremely difficult to fill the cavity with the various layers of material that are deposited in the replacement gate cavity to ultimately form the replacement gate structure. For example, problems such as "pinch off" may occur in the gate cavity wherein the materials effectively block off portions of the cavity such that the blocked portions cannot be filled with the desired materials. This problem is anticipated to become more of an issue as device shrinking continues, thereby requiring smaller and smaller gate cavities that need to be filled.

Another problem as it relates to the formation of FinFETs is directed to the problem of adequately controlling the channel region of the device. In general, it would be desirable for the fin height in the channel region to be as tall as possible so that better control of the channel region may be obtained. However, since prior processes uniformly establish the fin height by recessing an insulating material, the resulting height of the fins is substantially uniform in the source/drain regions and in the channel regions. Additional fin height can be achieved by uniformly etching the layer of insulating material after the fins are formed, but such an etching process will further damage the fins and the interlayer dielectric material so etched.

The present disclosure is directed to various methods of forming replacement gate structures for semiconductor devices, such as planar and 3D devices, that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming replacement gate structures for semiconductor devices and the resulting semiconductor devices. One method disclosed includes, among other things, forming a stack of sacrificial material layers above a semiconductor substrate, forming at least a sacrificial gate structure trench in the stack of sacrificial material layers, forming a sacrificial gate structure within the trench, performing at least one process operation to remove at least portions of the stack of sacrificial material layers and thereby expose sidewalls of the sacrificial gate structure, forming a sidewall spacer adjacent at least the exposed sidewalls of the sacrificial gate structure, removing at least the sacrificial gate structure so as to define a replacement gate cavity between the spacers, forming a replacement gate structure in the replacement gate cavity, and forming a gate cap above the replacement gate structure within the replacement gate cavity.

Another illustrative method disclosed herein for forming a FinFET device includes, among other things, forming a plurality of trenches in a semiconductor substrate to define at least one fin, forming a layer of insulating material in the trenches, wherein the layer of insulating material has an initial upper surface that exposes a first height of the fin, forming a plurality of sacrificial materials around the fin and above the layer of insulating material, performing at least one etching process on the plurality of sacrificial materials to define a sacrificial gate structure trench in the plurality of sacrificial materials in an area corresponding to a channel region of the device, the sacrificial gate structure trench exposing an upper surface of the layer of insulating material, and performing an etching process through the sacrificial gate structure trench to reduce a thickness of the exposed portion of the layer of insulating material such that, after performing the etching process, the exposed portion of the layer of insulating material has an etched upper surface that is at a level that is below the initial upper surface and exposes a second height of the fin under the sacrificial gate structure trench, wherein the second height is greater than the first height.

One illustrative FinFET device disclosed herein includes, among other things, a fin defined by a plurality of trenches in a semiconductor substrate, a gate structure positioned around the fin, a layer of insulating material positioned in the trenches, wherein a first portion of the layer of insulating material positioned under the gate structure has a first thickness and a second portion of the layer of insulating material positioned below the source/drain regions has a second thickness, wherein the first thickness is less than the second thickness.

BRIEF DESCRIPTION OF THE DRAWINGS

The disclosure may be understood by reference to the following description taken in conjunction with the accompanying drawings, in which like reference numerals identify like elements, and in which.

Figure 1:
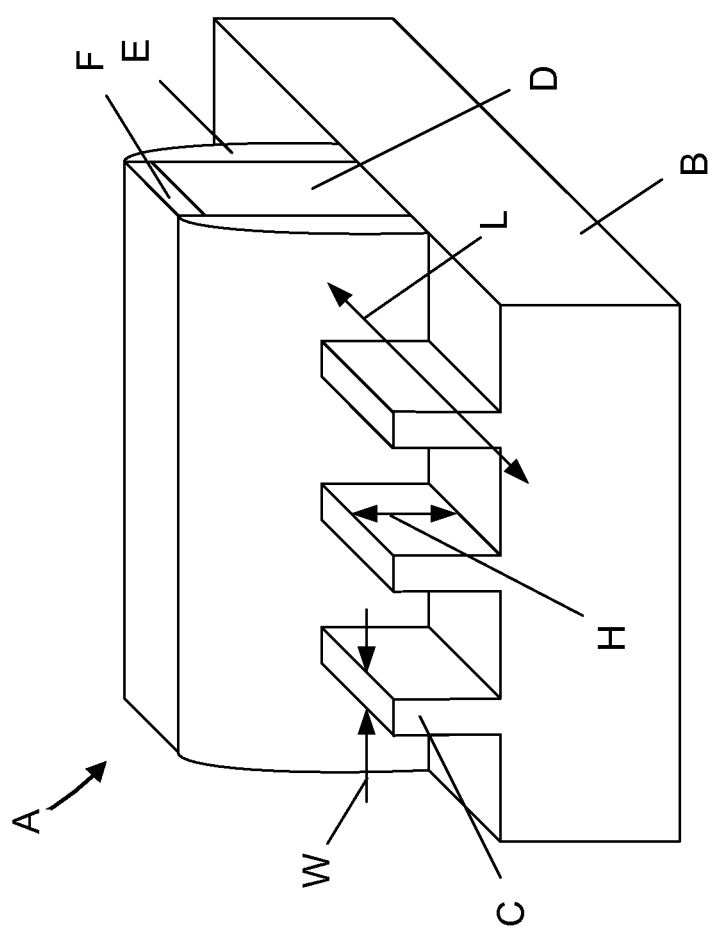
FIG. 1 is a perspective view of an illustrative prior art FinFET semiconductor device.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally relates to various methods of forming replacement gate structures for semiconductor devices and the resulting semiconductor devices. Moreover, as will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. The methods and devices disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. With reference to the attached figures, various illustrative embodiments of the methods and devices disclosed herein will now be described in more detail.

As will be appreciated by those skilled in the art after a complete reading of the present application, the methods and structures disclosed herein may be used when forming either planar or 3D transistor devices. An illustrative device 100 in the form of a FinFET device will be depicted for purposes of disclosing the subject matter set forth herein. However, as noted above, the methods and structures disclosed herein may be employed in fabricating planar or so-called 3D devices. Moreover, the transistor devices that are depicted in the attached drawings may be either NMOS or PMOS devices. Additionally, various doped regions, e.g., source/drain regions, halo implant regions, well regions and the like, are also not depicted in the attached drawings. The illustrative integrated circuit product 100 depicted in the drawings is formed above an illustrative substrate 102 that may have a variety of configurations, such as the depicted bulk silicon configuration. The substrate 102 may be made of silicon or it may be made of materials other than silicon. Thus, the terms "substrate" or "semiconductor substrate" should be understood to cover all semiconducting materials and all forms of such materials.

In general, the drawings contain a plan view and various cross-sectional views that are taken where indicated in the plan view. The plan view in FIG. 2A depicts a product or device 100 comprised of two illustrative fins 106, although the methods disclosed herein may be employed in manufacturing a FinFET device comprised of any number of fins. The view "X-X" is a cross-sectional view taken through what will become the source/drain (S/D) regions of the device 100. The view "Y-Y" is a cross-sectional view that is taken through the long axis of the gate structures, i.e., a cross-sectional view through the gate structure in the gate-width direction of the transistor device. The view "Z-Z" is a cross-sectional view that is taken through the long axis of the fins 106 of the device.

FIG. 2A depicts the device 100 at a point in fabrication wherein several process operations have been performed. First, a plurality of trenches 104 were formed in the substrate 102 to thereby define a plurality of fins 106. The illustrative FinFET devices disclosed herein will be depicted as being comprised of two illustrative fins 106. However, as will be recognized by those skilled in the art after a complete reading of the present application, the methods and devices disclosed herein may be employed when manufacturing FinFET devices having any number of fins. In one embodiment, the trenches 104 were formed by performing an etching process through a patterned etch mask (not shown) e.g., a patterned hard mask layer, using known etching techniques. The patterned etch mask may be patterned using known sidewall image transfer techniques and/or photolithographic techniques, combined with performing known etching techniques. In some applications, a further etching process may be performed to reduce the width or to "thin" the fins 106, although such a thinning process is not depicted in the attached drawings. For purposes of this disclosure and the claims, the use of the terms "fin" or "fins" should be understood to refer to fins that have not been thinned as well as fins that have been subjected to such a thinning etch process. Thereafter, a layer of insulating material 108 was deposited on the substrate 102 so as to over-fill the trenches 104. Then, a recess etching process was performed on the layer of insulating material 108 such that the insulating material 108 only remains in the bottom of the trenches 104 so as to locally isolate the fins 106 from one another. This recess etching process exposes the fins 106 in the source/drain regions of the device 100 to their approximate desired final fin height.

With continuing reference to FIG. 2A, the overall size, shape and configuration of the trenches 104 and fins 106 may vary depending on the particular application. The depth and width of the trenches 104 may vary depending upon the particular application. In one illustrative embodiment, based on current day technology, the depth of the trenches 104 may range from approximately 40-200 nm and the width of the trenches 104 may be about 15-60 nm. In some embodiments, the fins 106 may have a final width (at or near the bottom of the fin) within the range of about 5-20 nm. In the illustrative examples depicted in the attached figures, the trenches 104 and fins 106 are all of a uniform size and shape. However, such uniformity in the size and shape of the trenches 104 and the fins 106 is not required to practice at least some aspects of the inventions disclosed herein. In the example depicted herein, the trenches 104 are formed by performing an anisotropic etching process that results in the trenches 104 having a schematically depicted, generally rectangular configuration. In an actual real-world device, the sidewalls of the trenches 104 may be somewhat inwardly tapered, although that configuration is not depicted in the drawings. In some cases, the trenches 104 may have a reentrant profile near the bottom of the trenches 104. To the extent the trenches 104 are formed by performing a wet etching process, the trenches 104 may tend to have a more rounded configuration or non-linear configuration as compared to the generally rectangular configuration of the trenches 104 that are formed by performing an anisotropic etching process. Thus, the size and configuration of the trenches 104 and the fins 106, and the manner in which they are made, should not be considered a limitation of the present invention. For ease of disclosure, only the substantially rectangular trenches 104 and fins 106 will be depicted in subsequent drawings.

As noted previously, the final gate structures for the illustrative FinFET device 100 disclosed herein may be formed using "gate-last" or replacement gate techniques. FIG. 2B depicts the device 100 after one or more sacrificial materials 103 have been formed above the device 100. In one illustrative embodiment, the sacrificial materials 103 are comprised of first, second and third sacrificial material layers 110, 112 and 114. Of course, depending upon the particular process flow and materials selected, the sacrificial materials 103 may be formed of more or fewer layers of material. As one example, the first sacrificial material layer 110 may be an insulating material comprised of, for example, silicon dioxide, etc. Similarly, the second sacrificial material layer 112 may also be made of a material such as polysilicon or amorphous silicon, etc. Also depicted is a first sacrificial cap layer 114 that may be comprised of a variety of materials, such as silicon nitride. As will be recognized by those skilled in the art after a complete reading of the present application, the various layers of the sacrificial material structure 103 may be comprised of a variety of different materials, may have a variety of configurations, and may be formed using a variety of manufacturing techniques. That is, the sacrificial material layer 110, the sacrificial material layer 112 and the first sacrificial cap layer 114 may be formed by any of a variety of different known techniques, e.g., a chemical vapor deposition (CVD) process, an atomic layer deposition (ALD) process, a thermal growth process, spin-coating techniques, etc. The thicknesses of these various layers of material may also vary depending upon the particular application.

Figure 2C:
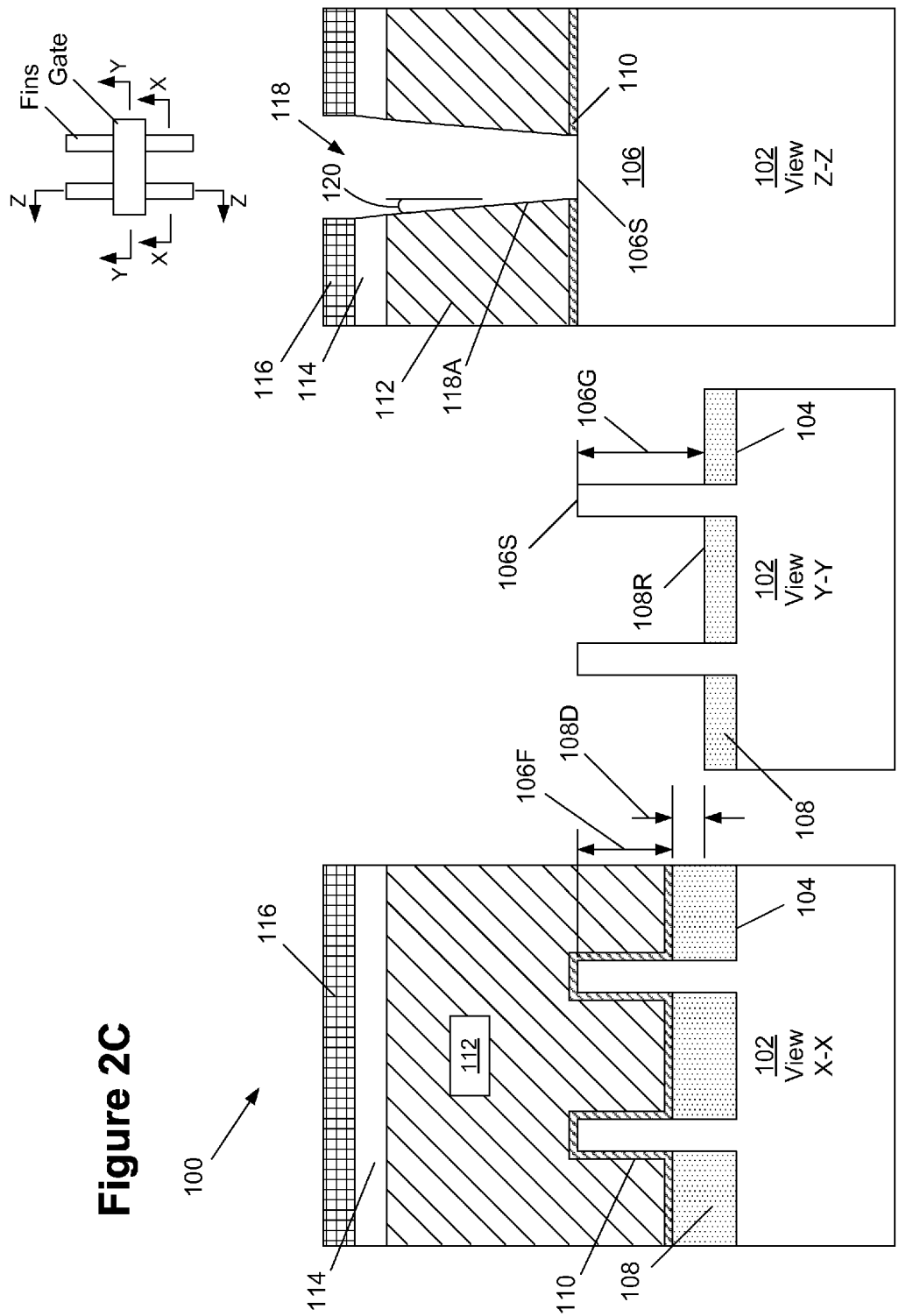
FIGS. 2A-2P depict various illustrative methods disclosed herein for various methods of forming replacement gate structures for semiconductor devices, such as planar and 3D devices, and the resulting semiconductor devices.

FIG. 2C depicts the product 100 after several process operations have been performed. First, a patterned etch mask layer 116, e.g., a patterned layer of photoresist, was formed above the sacrificial cap layer 114. Thereafter, one or more etching processes were performed through the patterned etch mask layer 116 so as to etch the underlying layers 114, 112 and 110. This etching process sequence defines a sacrificial gate structure trench 118 that exposes an upper surface 106S of the fins 106. The patterned etch mask layer 116 may or may not be removed in some point in the etching sequence that is performed to form the sacrificial gate structure trench 118 that exposes the upper surface 106S of the fins 106. The sacrificial gate structure trench 118 has a generally tapered configuration, wherein the tapered sidewalls 118A of the sacrificial gate structure trench 118 are formed at an angle 120 that falls within a range of about 1-5° relative to a line normal to the surface of the substrate 102.

With continuing reference to FIG. 2C, after the sacrificial gate structure trench 118 was formed, an etching process is performed to recess the layer of insulating material 108 exposed by the sacrificial gate structure trench 118. That is, within the sacrificial gate structure trench 118, the layer of insulating material 108 has a recessed, etched surface 108R that is lower than the initial surface of the layer of insulating material 108 by a distance 108D. The distance 108D may vary depending upon the particular application. In one illustrative embodiment, the distance 108D may be about 5-15 nm. Stated another way, the thickness of the insulating material 108 locally under the sacrificial gate structure trench 118, i.e., the area that will become the channel region of the device, is less than the thickness of the insulating material 108 under what will become the source/drain regions of the device. Importantly, using the methods disclosed herein, the fin height 106G within the channel region of the device is greater than the fin height 106F in the source/drain regions of the device. This additional height of the fins 106 in the channel region enables better control of the channel region during operation of the device 100.

Figure 2D:
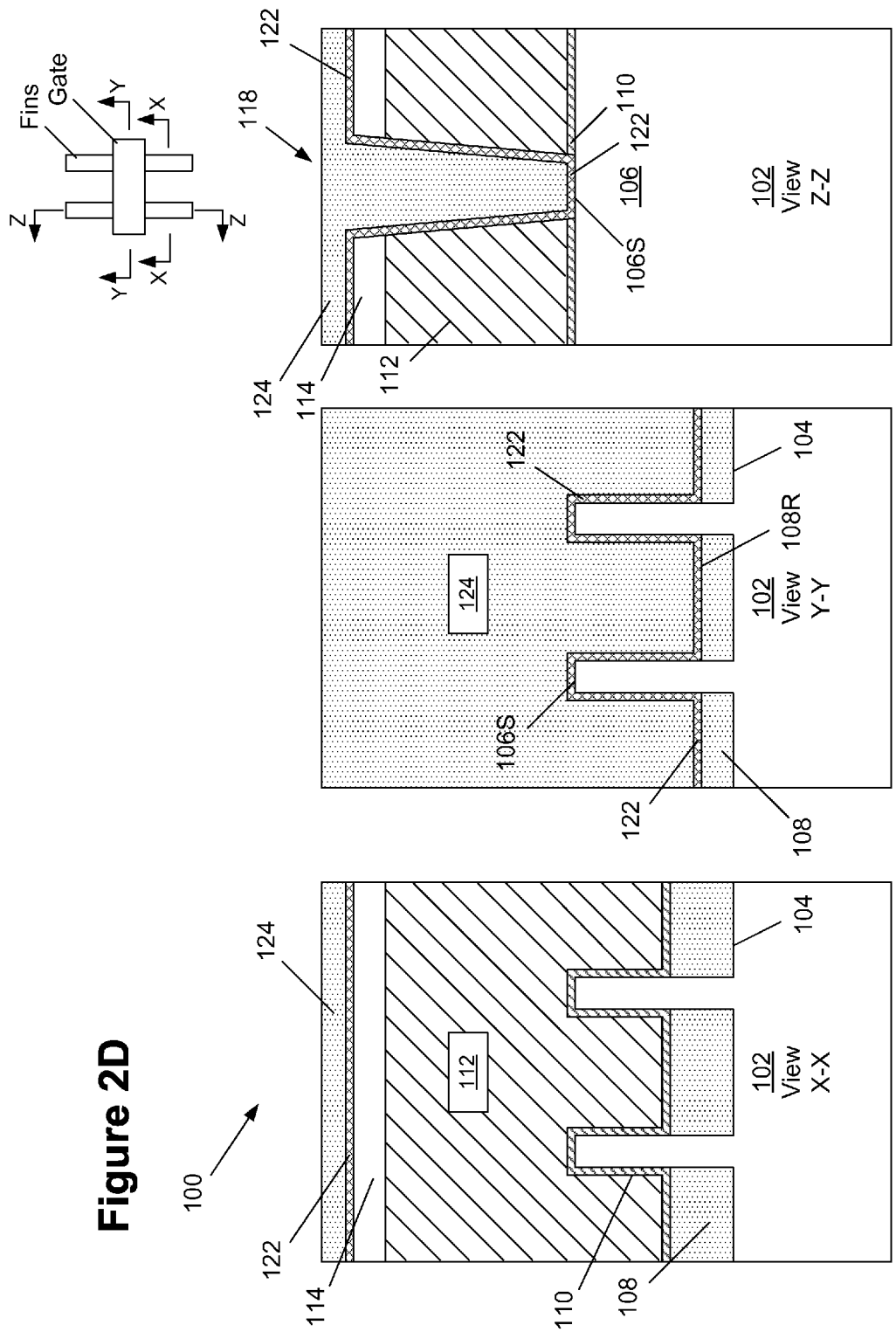

The next several processing operations are directed to forming a sacrificial gate structure in the sacrificial gate structure trench 118. Ultimately, the sacrificial gate structure will be removed and replaced with a final gate structure for the device 100. Accordingly, FIG. 2D depicts the device 100 after several process operations have been performed. First, if it has not previously been removed, the patterned etch mask layer 116 is removed. Then, in one illustrative embodiment, a sacrificial gate insulation layer 122 is deposited on the device and in the sacrificial gate structure cavity 118. Next, an illustrative sacrificial gate electrode material 122 is deposited on the sacrificial gate insulation layer 122 and in the sacrificial gate structure cavity 118. The sacrificial gate insulation layer 122 may be comprised of a variety of different materials, such as, for example, silicon dioxide, etc. Similarly, the sacrificial gate electrode material 124 may also be of a material such as polysilicon or amorphous silicon, etc.

Figure 2E:
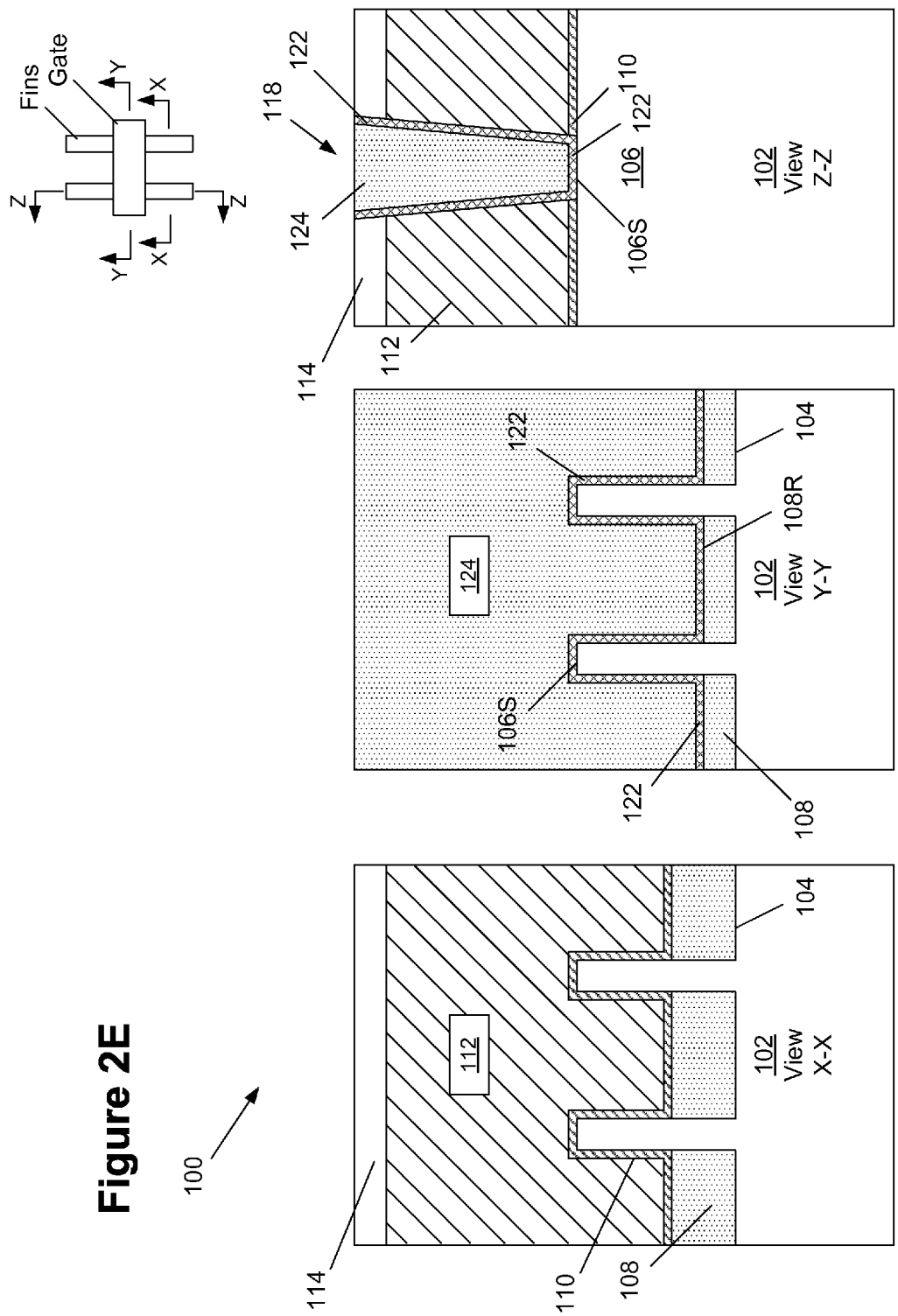

With reference to FIG. 2E, a planarization process, such as a CMP process or an etch-back process was then performed using the sacrificial cap layer 114 as a polish-stop layer or an etch-stop layer to remove the portions of the sacrificial gate insulation layer 122 and the sacrificial gate electrode material 124 positioned above the sacrificial cap layer 114 outside of the sacrificial gate structure trench 118.

Figure 2F:
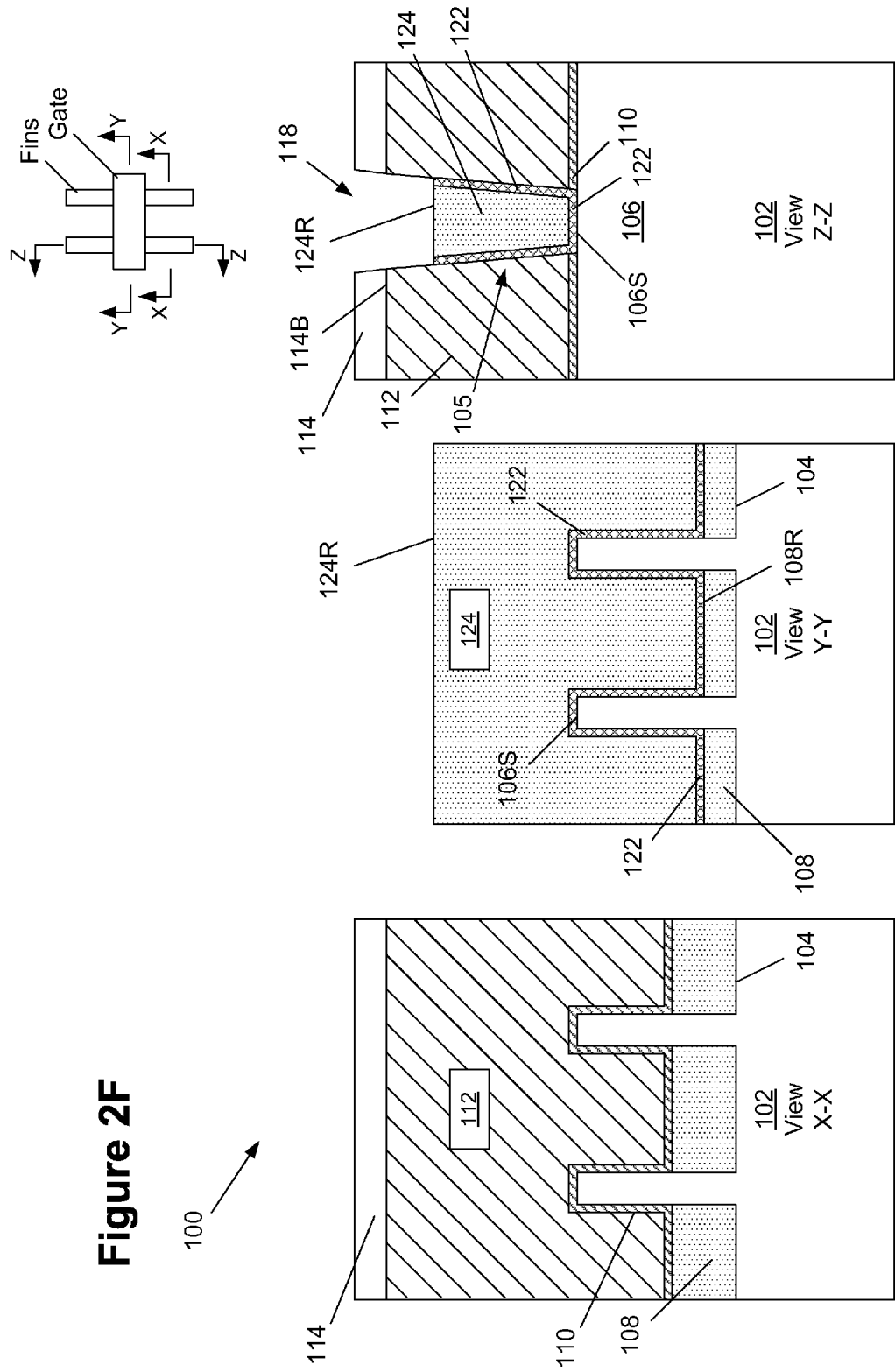

FIG. 2F depicts the device after one or more recessing etch-back processes were performed to recess the materials within the sacrificial gate structure trench 118. This results in the sacrificial gate electrode material 124 having a recessed surface 124R that is below the level of the bottom surface 114B of the sacrificial cap layer 114. In one embodiment, the sacrificial gate insulation layer 122 and the sacrificial gate electrode material 124 depicted in FIG. 2F constitute the sacrificial gate structure 105 for the device that will ultimately be removed in subsequent processing operations, as described more fully below. As will be recognized by those skilled in the art after a complete reading of the present application, the sacrificial gate structure 105 depicted in the drawings is intended to be representative in nature. That is, the sacrificial gate structure 105 may be comprised of a variety of different materials and it may have a variety of configurations.

Figure 2G:
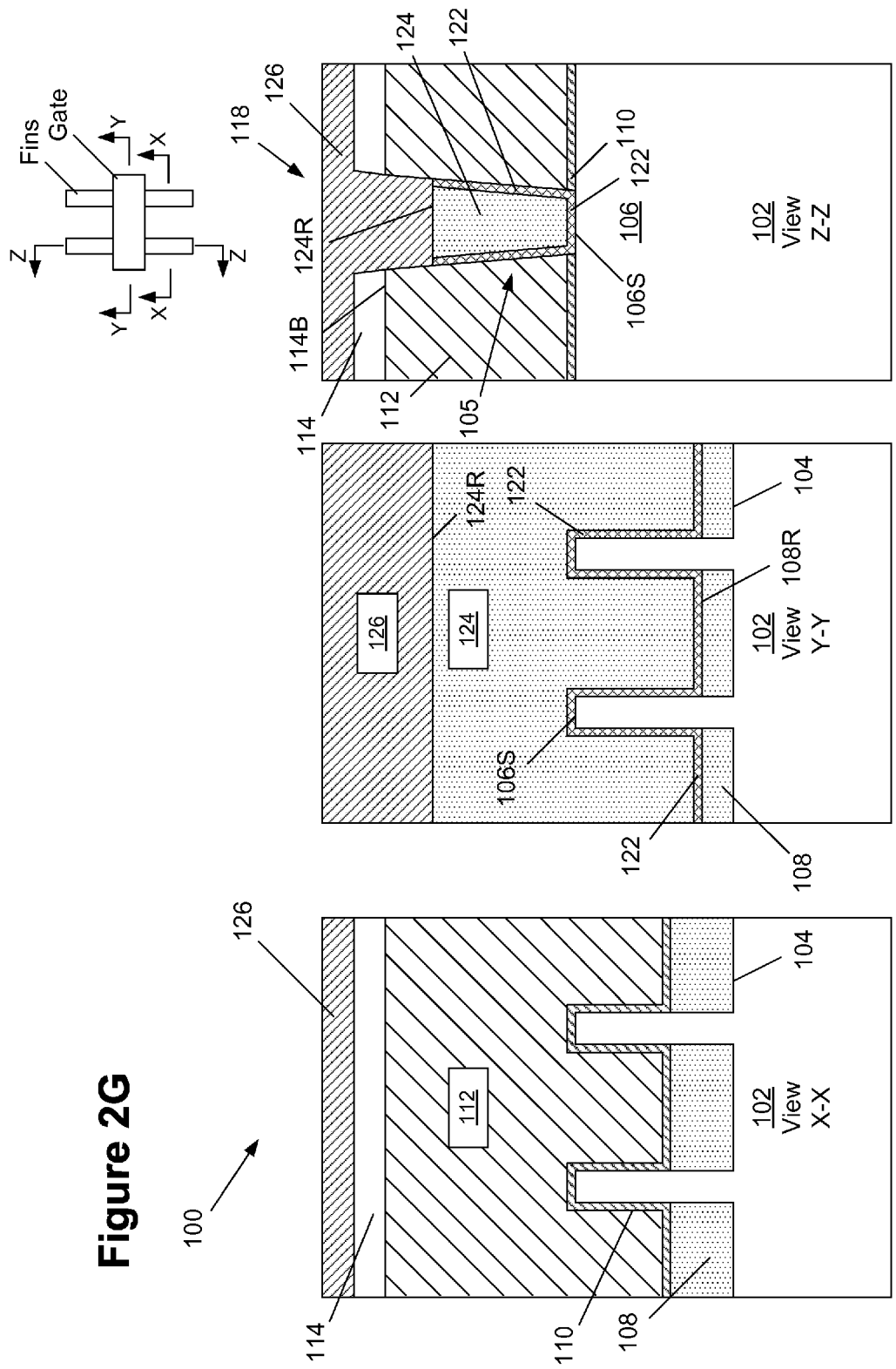
Figure 2H:
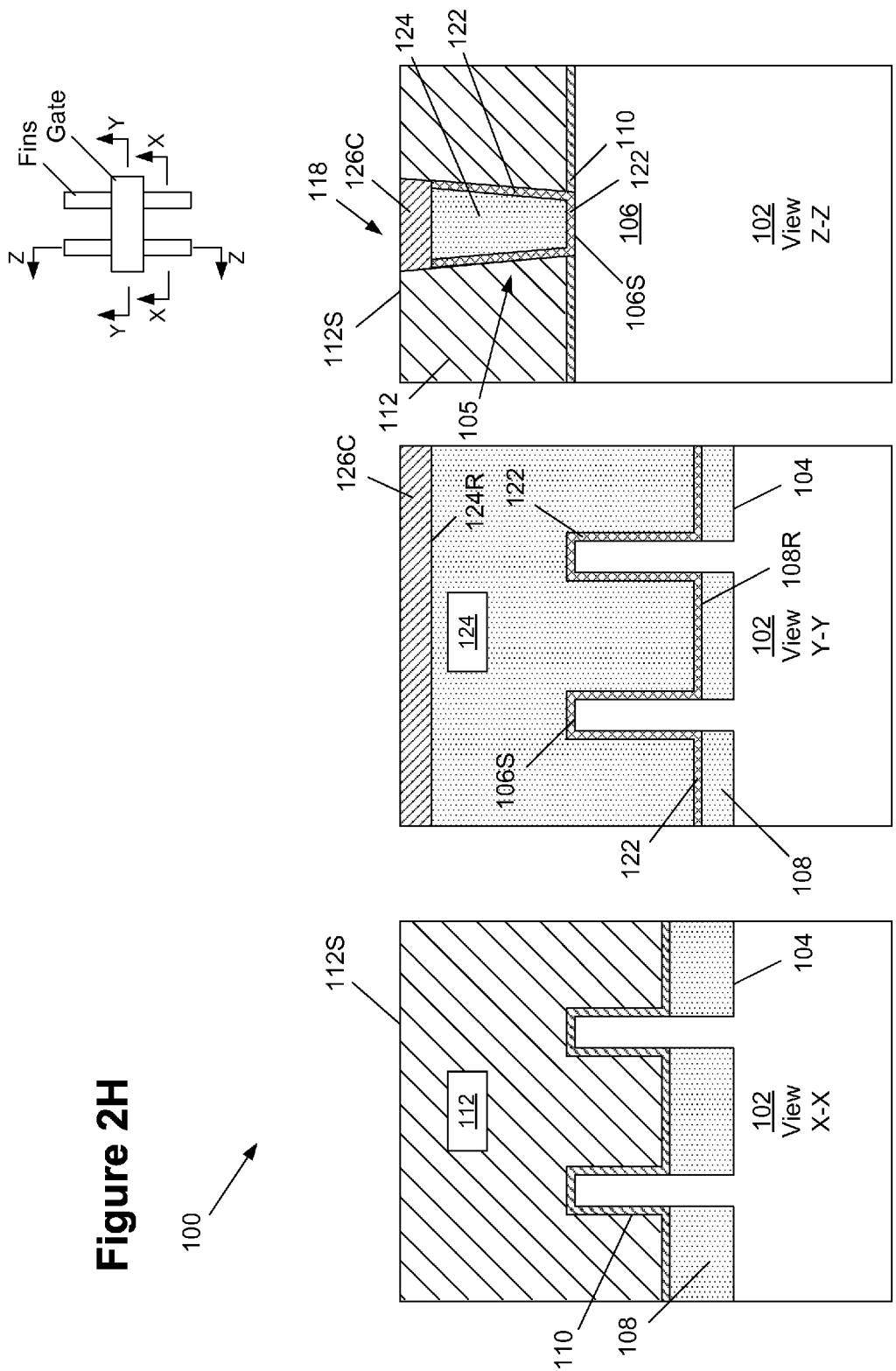

FIGS. 2G-2H depict a processing sequence wherein a gate cap 126C is formed above the sacrificial gate structure 105 in the remaining unfilled portion of the sacrificial gate structure trench 118. In one illustrative embodiment, a gate cap layer of material 126 is deposited on the device and in the sacrificial gate structure cavity 118. The gate cap layer of material 126 may be comprised of a material such as silicon nitride, and it may be formed by performing a chemical vapor deposition (CVD) process, etc. With reference to FIG. 2H, a planarization process, such as a CMP process or an etch-back process, was then performed using the sacrificial material layer 112 as a polish-stop layer or an etch-stop layer. This process operation exposes an upper surface 112S of the sacrificial material layer 112 and removes portions of the gate cap layer of material 126 and all of the first sacrificial cap layer 114 and results in the definition of the gate cap 126C positioned above the sacrificial gate structure 105 within the sacrificial gate structure trench 118.

Figure 2I:
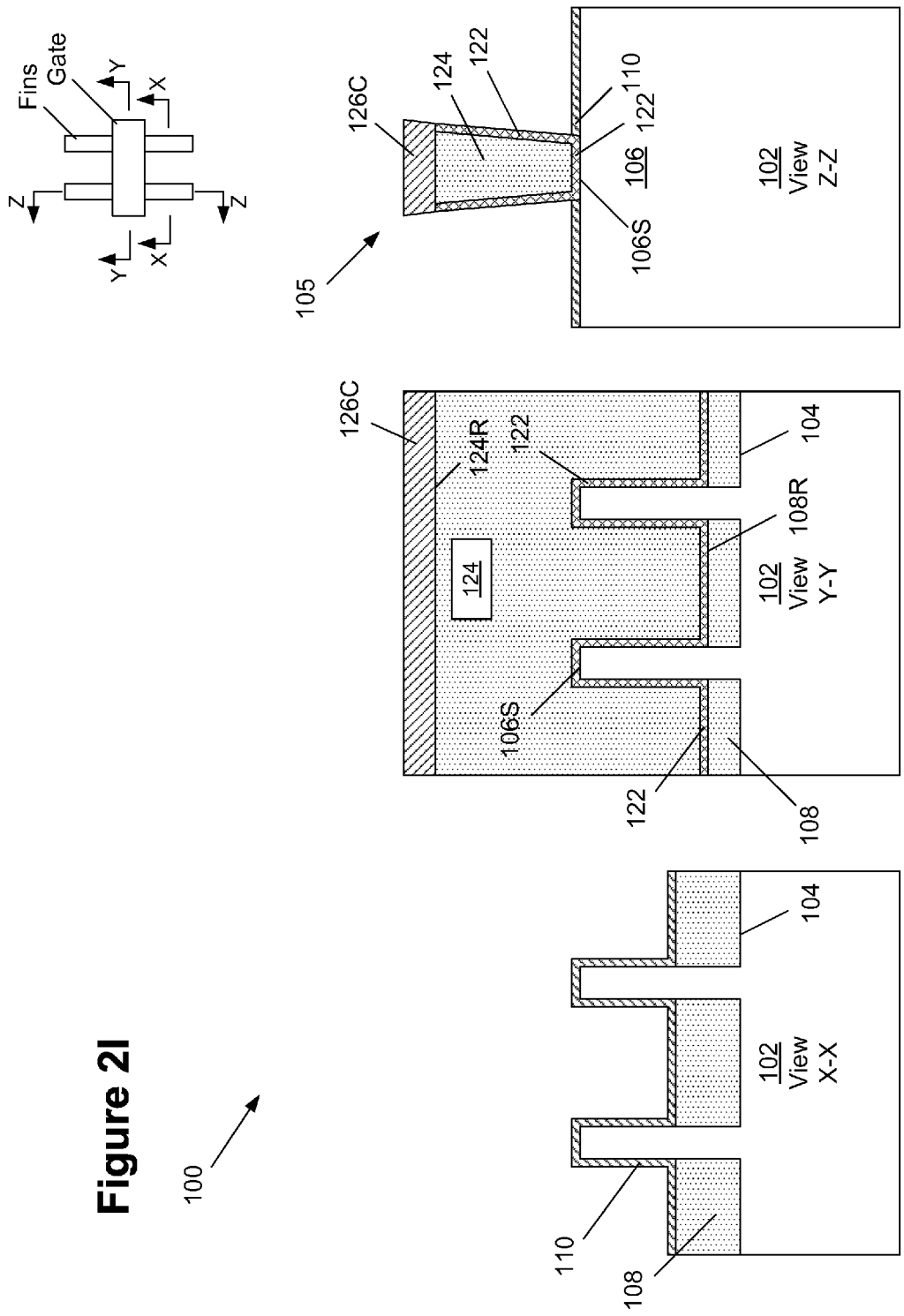

FIG. 2I depicts the device 100 after one or more etching processes have been performed to remove the sacrificial material layer 112 selectively relative to the first sacrificial material layer 110, the sacrificial gate insulation layer 122 and the gate cap 126C.

FIG. 2J depicts the device 100 after several process operations have been performed. First, a sidewall spacer 128 is formed adjacent the sacrificial gate structure 105. The sidewall spacer 128 may be formed by depositing a layer of spacer material, e.g., silicon nitride, and thereafter performing an anisotropic etching process on the layer of spacer material so as to result in the spacers 128 depicted in FIG. 2J. The base thickness or width of the spacers 128 may vary depending upon the particular application. During the formation of the spacers 128, the first sacrificial material layer 110 serves as an etch-mask to protect the surface of the fins 106. Next, after the spacers 128 are formed, an etching process may be performed to remove the exposed portions of the first sacrificial material layer 110. This exposes the fins 106 in what will become the source/drain regions of the device 100. See View X-X. Next, if desired, epi semiconductor material 130 may be formed on the exposed portions of the fins 106 positioned laterally outside of the spacers 128. In the depicted example, the epi semiconductor material has a diamond-like configuration due to the nature of the epi deposition process and the crystallographic orientation of the fins 106. For reference purposes, FIG. 2J contains a dashed line 106X that represents the original outline of the fins 106.

FIG. 2K depicts the device 100 after several process operations have been performed. First, a layer of insulating material 132, e.g., silicon dioxide, was blanket-deposited across the device 100. Next, a planarization process, such as a CMP process or an etch-back process, was then performed using the sacrificial gate electrode material 124 as a polish-stop layer or an etch-stop layer. This process operation removes the gate cap 126C and exposes the sacrificial gate structure 105 for removal.

Figure 2L:
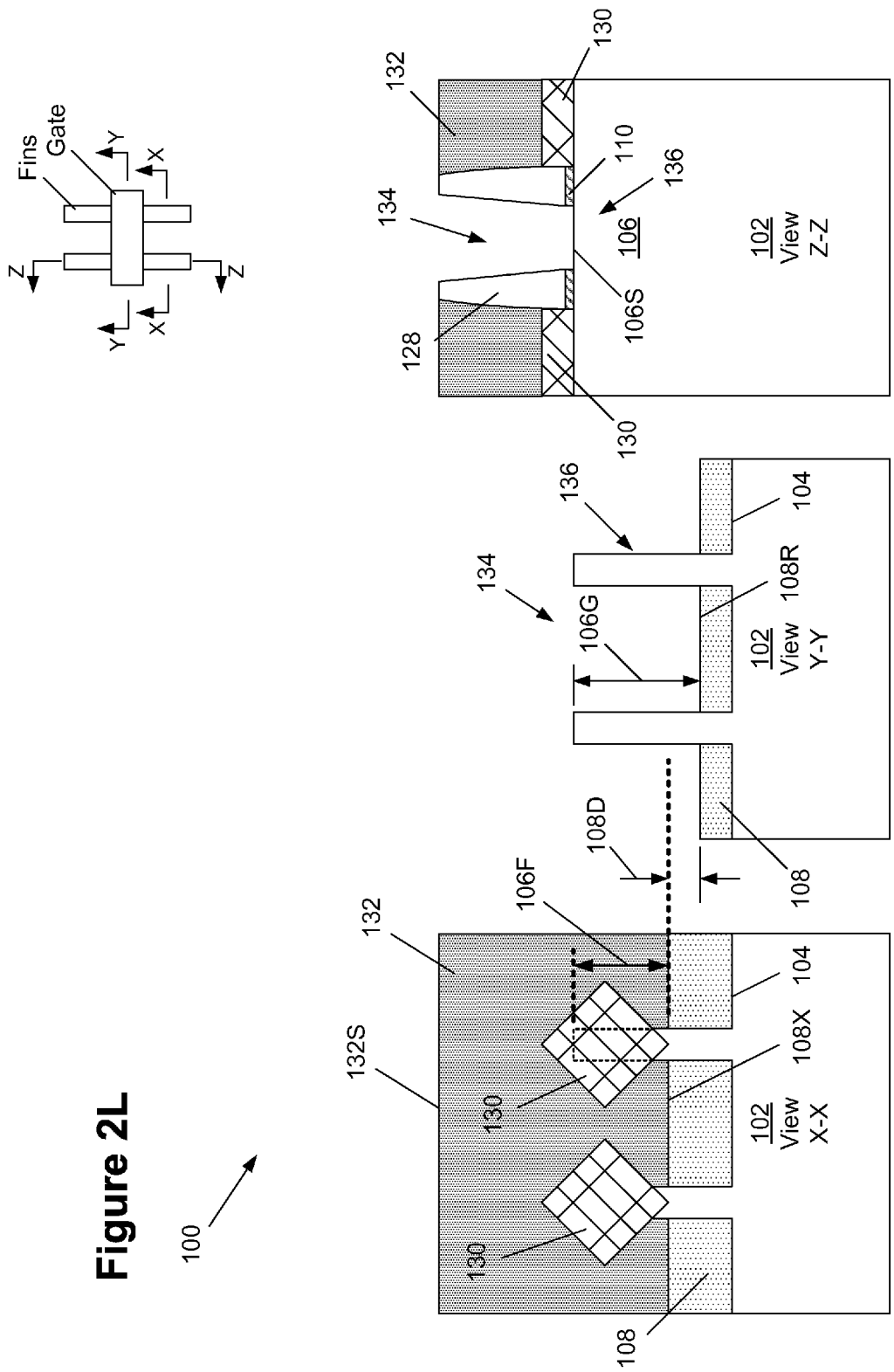

As shown in FIG. 2L, one or more etching processes are performed to remove the sacrificial gate structure 105, i.e., the sacrificial gate electrode material 124 and the sacrificial gate insulation layer 122, so as to define a replacement gate cavity 134 where a replacement gate structure will subsequently be formed. Typically, the sacrificial gate insulation layer 122 is removed as part of the replacement gate technique, as depicted herein, so as to expose the surface 106S of the fins 106 within the replacement gate cavity 134. However, the sacrificial gate insulation layer 122 may not be removed in all applications. Even in cases where the sacrificial gate insulation layer 122 is intentionally removed, there will typically be a very thin native oxide layer (not shown) that forms on the fins (for a FinFET device) or the substrate (for a planar device) within the replacement gate cavity 134. Importantly, as noted above, due to the previous recessing of the layer of insulating material 108 locally in the channel region 136 of the device (see FIG. 2C), the fin height 106G within the channel region 136 of the device 100 is greater than the fin height 106F in the source/drain regions of the device. This additional height of the fins 106 in the channel region enables better control of the channel region 136 during operation of the device 100.

Figure 2N:
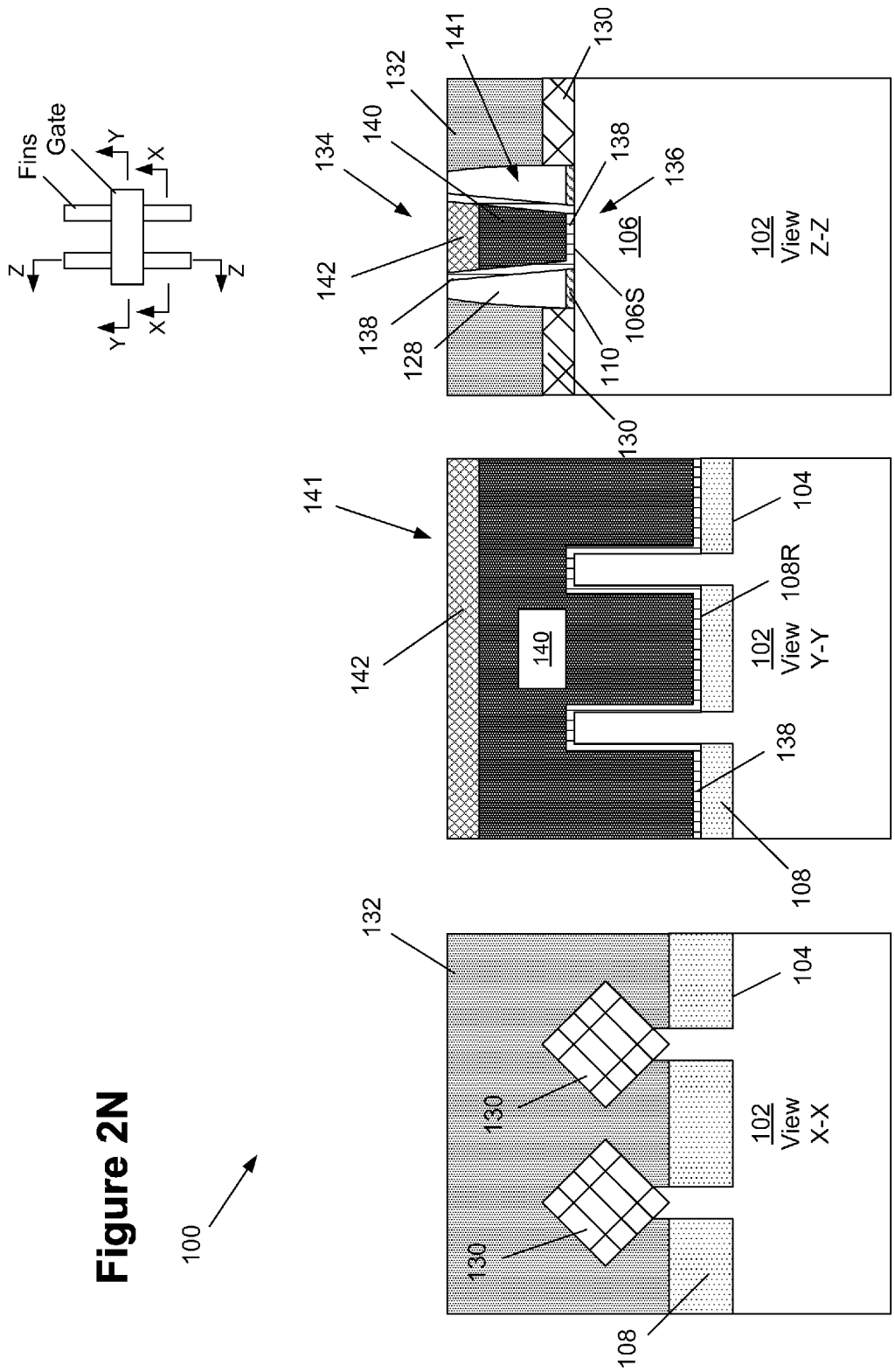

The next several processing operations are directed to forming a final or replacement gate structure in the replacement gate cavity 134. With reference to FIGS. 2M-N, a high-k (k value 10 or greater) gate insulation layer 138, such as hafnium oxide, may be deposited across the device and in the replacement gate cavity 134 by performing a conformal deposition process. FIG. 2N depicts the device 100 after a schematically depicted replacement gate electrode structure 140 and a gate cap 142 have been formed in the gate cavity 134. The gate cap 142 and the gate electrode structure 140 constitute the replacement gate 141 for the device 100.

Several process flows may be used to form the replacement gate 141. First, one or more layers of material (typically including one or more metal-containing layers) that are part of the gate electrode structure 140 for the replacement gate 141 for the device were deposited above the structure shown in FIG. 2M and in the replacement gate cavity 134. After the materials of the replacement gate structure 141 were formed in the replacement gate cavity 134, a CMP process was performed to remove the excess materials positioned outside of the replacement gate cavity 134. Thereafter, one or more dry or wet etching processes may be performed to remove or recess portions of the materials of the replacement gate structure 141 and thereby define a recess within the upper portion of the replacement gate cavity 134. The gate cap 142 may then be formed in the recess. The gate cap 142 may be comprised of a variety of materials, e.g., silicon nitride, etc. In one embodiment, the gate cap 142 may be formed by blanket-depositing a cap layer material, e.g., silicon nitride, on the device 100 so as to over-fill the recess in the replacement gate cavity 134 above the replacement gate structure 141 and thereafter performing a planarization process, e.g., CMP processes, to remove the portions of the cap layer material positioned above the surface of the layer of insulating material 132 and outside of the replacement gate cavity 134.

As will be appreciated by those skilled in the art after a complete reading of the present application, the replacement gate structure 141 is intended to be representative in nature of any type of gate structure that may be employed in manufacturing integrated circuit products using so-called gate-last (replacement gate) manufacturing techniques. Such a replacement gate structure typically comprises a high-k (k value greater than 10) gate insulation layer (not individually shown), such as hafnium oxide, one or more metal layers (not individually shown) (e.g., layers of titanium nitride or TiAlC, depending upon the type of transistor device being manufactured), and a bulk conductive material layer (not individually shown), such as tungsten or aluminum. The materials used for the replacement gate structures for NMOS and PMOS devices are typically different.

FIG. 2O represents an optional process flow. FIG. 2D depicted a process flow in which the sacrificial gate insulation layer 122 was deposited on the device and in the sacrificial gate structure cavity 118. In the optional process flow depicted in FIG. 2O, the sacrificial gate insulation layer may be formed by performing a thermal growth process. Such a thermally grown sacrificial gate insulation layer has been labeled with the reference number 122A in FIG. 2O. As can be seen, using this process flow, the thermally grown sacrificial gate insulation layer 122A only forms on the exposed surface of the fins 106 and the sidewalls of the sacrificial material layer 112 (polysilicon or amorphous silicon) within the sacrificial gate structure trench 118.

FIG. 2P represents another optional process flow in which a different material for the sacrificial material layers 110 and 112 may be used. FIG. 2D depicted a process flow in which the sacrificial material layer 110 was comprised of silicon dioxide and the sacrificial material layer 112 was comprised of a silicon-based material that may be oxidized, such as polysilicon or amorphous silicon. In the optional process flow depicted in FIG. 2P, the sacrificial material layer 110 may be comprised of a high-k material, e.g., hafnium oxide, while the sacrificial material layer 112 may be comprised of an insulating material, such as a flowable oxide material. Reference numbers 110A and 112A are used in FIG. 2P to depict these alternative materials. As can be seen, using this process flow, the thermally grown sacrificial gate insulation layer 122A only forms on the exposed surface of the fins 106 within the sacrificial gate structure trench 118.

As will be appreciated and understood by those skilled in the art after a complete reading of the present application, there are several novel methods and devices disclosed herein. For example, by forming the sacrificial gate structure trench 118 using a trench-type etching process sequence, the sidewalls 118A (see FIG. 2C) have an inwardly-tapered configuration, i.e., the sacrificial gate structure trench 118 is wider at the top of the trench than it is at the bottom of the trench. Ultimately, the replacement gate cavity 134 (see FIG. 2L) is formed with this same inwardly-tapered configuration wherein the cavity 134 is wider at the top of the cavity than it is at the bottom of the replacement gate cavity 134. Such a tapered replacement gate cavity 134 makes it easier to fill the cavity with the various layers of material that are deposited in the replacement gate cavity 134 to ultimately form the replacement gate structure 141 (see FIG. 2N). Additionally, with reference to FIG. 2C, after the sacrificial gate structure trench 118 was formed, the layer of insulating material 108 exposed by the sacrificial gate structure trench 118 is locally recessed so as to increase the exposed height of the fins 106 in the channel region of the device relative to the height of the fins 106 in the source/drain regions of the device 100. That is, within the area exposed by the sacrificial gate structure trench 118, the layer of insulating material 108 has a recessed, etched surface 108R that is lower than the initial surface of the layer of insulating material 108, i.e., the thickness of the insulating material 108R locally under the sacrificial gate structure trench 118, i.e., the channel region of the device, is less than the thickness of the insulating material 108 under what will become the source/drain regions of the device. The additional height of the fins 106 in the channel region enables better control of the channel region 136 during operation of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a replacement gate structure for a device, comprising:
    forming a stack of sacrificial material layers above a semiconductor substrate;
    forming at least a sacrificial gate structure trench in said stack of sacrificial material layers;
    forming a sacrificial gate structure within said sacrificial gate structure trench;
    performing at least one process operation to remove at least portions of said stack of sacrificial material layers and thereby expose sidewalls of said sacrificial gate structure;
    forming a sidewall spacer adjacent at least said exposed sidewalls of said sacrificial gate structure;
    removing at least said sacrificial gate structure so as to define a replacement gate cavity between said sidewall spacers;
    forming a replacement gate structure in said replacement gate cavity; and
    forming a gate cap above said replacement gate structure within said replacement gate cavity.

2. The method of claim 1, wherein said device is one of a FinFET device or a planar transistor device.

3. The method of claim 1, wherein forming said stack of sacrificial material layers above said semiconductor substrate comprises:
    forming a first layer of silicon dioxide on said semiconductor substrate;
    forming a second layer of polysilicon or amorphous silicon on said first layer; and
    forming a layer of silicon nitride on said second layer.

4. The method of claim 1, wherein forming said stack of sacrificial material layers above said semiconductor substrate comprises:
    forming a first layer of high-k insulation material on said semiconductor substrate;
    forming a second layer of silicon dioxide on said first layer; and
    forming a layer of silicon nitride on said second layer.

5. The method of claim 1, wherein forming said sacrificial gate structure within said sacrificial gate structure trench comprises performing a deposition process to form a sacrificial gate insulation layer within said sacrificial gate structure trench.

6. The method of claim 1, wherein forming said sacrificial gate structure within said sacrificial gate structure trench comprises performing a thermal growth process to form a thermally grown sacrificial gate insulation layer within said sacrificial gate structure trench.

7. The method of claim 1, wherein, after forming said sidewall spacer, removing any remaining exposed portions of said stack of sacrificial material layers.

8. A method of forming a replacement gate structure for a device, comprising:
    forming a stack of sacrificial material layers above a semiconductor substrate;
    performing at least one first etching process on said stack of sacrificial material layers to define a sacrificial gate structure trench in said stack of sacrificial material layers;
    forming a sacrificial gate structure within said sacrificial gate structure trench;
    forming a first gate cap above said sacrificial gate structure within said sacrificial gate structure trench;
    after forming said first gate cap, performing at least one process operation to remove at least portions of said stack of sacrificial material layers and thereby expose sidewalls of said sacrificial gate structure;
    forming a sidewall spacer adjacent at least said exposed sidewalls of said sacrificial gate structure;

forming a layer of insulating material adjacent said sidewall spacers;

after forming said layer of insulating material, removing said first gate cap and said sacrificial gate structure so as to define a replacement gate cavity;

forming a replacement gate structure in said replacement gate cavity; and forming a second gate cap above said replacement gate structure within said replacement gate cavity.

9. The method of claim 8, wherein forming said stack of sacrificial material layers above said semiconductor substrate comprises:

forming a first layer of silicon dioxide on said semiconductor substrate;

forming a second layer of polysilicon or amorphous silicon on said first layer; and forming a layer of silicon nitride on said second layer.

10. The method of claim 8, wherein forming said stack of sacrificial material layers above said semiconductor substrate comprises:

forming a first layer of high-k insulation material on said semiconductor substrate;

forming a second layer of silicon dioxide on said first layer; and forming a layer of silicon nitride on said second layer.

11. The method of claim 8, wherein forming said sacrificial gate structure within said sacrificial gate structure trench comprises performing a deposition process to form a sacrificial gate insulation layer within said sacrificial gate structure trench.

12. The method of claim 8, wherein forming said sacrificial gate structure within said sacrificial gate structure trench comprises performing a thermal growth process to form a thermally grown sacrificial gate insulation layer within said sacrificial gate structure trench.

13. The method of claim 8, wherein, after forming said sidewall spacer, removing any remaining exposed portions of said stack of sacrificial material layers.

14. A method of forming a FinFET device, comprising:

forming a plurality of trenches in a semiconductor substrate to define at least one fin;

forming a layer of insulating material in said plurality of trenches, said layer of insulating material having an initial upper surface that exposes a first height of said fin;

forming a plurality of sacrificial materials around said fin and above said layer of insulating material;

performing at least one etching process on said plurality of sacrificial materials to define a sacrificial gate structure trench in said plurality of sacrificial materials in an area corresponding to a channel region of said device, said sacrificial gate structure trench exposing an upper surface of said layer of insulating material; and performing an etching process through said sacrificial gate structure trench to reduce a thickness of said exposed portion of said layer of insulating material such that, after performing said etching process, said exposed portion of said layer of insulating material has an etched upper surface that is at a level that is below said initial upper surface and exposes a second height of said fin under said sacrificial gate structure trench, wherein said second height is greater than said first height.

15. The method of claim 14, further comprising:

forming a sacrificial gate structure in said sacrificial gate structure trench;

removing said sacrificial gate structure to define a replacement gate cavity positioned between two sidewall spacers; and forming a replacement gate structure in said replacement gate cavity above said etched upper surface of said layer of insulating material and around said fin having said second height.

* * * * *